US008906783B2

United States Patent
Feng et al.

(10) Patent No.: US 8,906,783 B2
(45) Date of Patent: Dec. 9, 2014

(54) METHOD FOR CUTTING BRITTLE SHEET-SHAPED STRUCTURE

(71) Applicants: Tsinghua University, Beijing (CN); Hon Hai Precision Industry Co., Ltd., New Taipei (TW)

(72) Inventors: Chen Feng, Beijing (CN); Li Qian, Beijing (CN); Yu-Quan Wang, Beijing (CN); Xue-Wei Guo, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/758,062

(22) Filed: Feb. 4, 2013

(65) Prior Publication Data

US 2013/0330909 A1 Dec. 12, 2013

(30) Foreign Application Priority Data

Jun. 12, 2012 (CN) .......................... 2012 1 01919620

(51) Int. Cl.
*B26F 3/00* (2006.01)
*H01L 21/304* (2006.01)

(52) U.S. Cl.
CPC .............. *B26F 3/002* (2013.01); *H01L 21/304* (2013.01)
USPC .............................................. 438/462; 225/2

(58) Field of Classification Search
None
See application file for complete search history.

(56) References Cited

U.S. PATENT DOCUMENTS 4,247,031 A * 1/1981 Pote et al. .......................... 225/2
2004/0053053 A1 * 3/2004 Jiang et al. .................... 428/408

FOREIGN PATENT DOCUMENTS

JP 2002-87836 3/2002

OTHER PUBLICATIONS

Maria di Spirito, Stained Glass Workshop, Sterling Publishing Company, 2001.*

* cited by examiner

*Primary Examiner* — Charles Garber
*Assistant Examiner* — Alia Sabur
(74) *Attorney, Agent, or Firm* — Novak, Druce Connolly Bove + Quigg LLP

(57) ABSTRACT

A method for cutting brittle sheet-shaped structure is disclosed. A brittle sheet-shaped structure having a cutting surface including a first cutting line on the cutting surface of the brittle sheet-shaped structure is formed. The cutting surface is divided into a first section and a second section, wherein the first section has a predetermined shape. At least one second cutting line is formed on the second section along part of the first cutting line or a tangent line of the first cutting line. A number of third cutting lines are formed on the second section by taking the first cutting line as endpoints. A brittle sheet-shaped structure having the predetermined shape is finally obtained by splitting the brittle sheet-shaped structure along the first cutting line, the at least one second cutting line, and the third cutting lines.

20 Claims, 4 Drawing Sheets

METHOD FOR CUTTING BRITTLE SHEET-SHAPED STRUCTURE

CROSS-REFERENCE TO RELATED APPLICATIONS

This application claims all benefits accruing under 35 U.S.C. §119 from China Patent Application No. 201210191962.0, filed on Jun. 12, 2012 in the China Intellectual Property Office, which is incorporated herein by reference.

BACKGROUND

1. Technical Field

The present disclosure relates to methods for cutting brittle sheet-shaped structure.

2. Description of Related Art

Brittle material is easily broken without significant deformation when it is subjected to stress. The brittle materials absorb relatively little energy prior to fracture, even those of high strength, such as silicon wafer, glasses, and most of ceramics. An ordinary method for cutting brittle materials includes forming cutting lines on surface of the brittle materials with laser or external force, wherein the cutting lines form a predetermined rectangular section. The brittle materials then will be split automatically or manually, thus obtaining the predetermined rectangular brittle materials.

Silicon wafer is a single crystalline structure having distinct crystallographic orientation. When a silicon wafer breaks, it is apt to fracture along its dissociation planes. Thus, the fracture surface is always a regular plane surface and not a curved surface. Therefore, silicon wafer with particular-shaped structures such as circular-shaped, elliptical-shaped, fan-shaped, and irregular polygonal-shaped structure is difficult to obtain by the ordinary method. Other brittle materials such as glasses and ceramics are also difficult to form particular-shaped structures by the ordinary method.

What is needed, therefore, is to provide a cutting method by which a particular and sheet-shaped brittle structure can be obtained.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
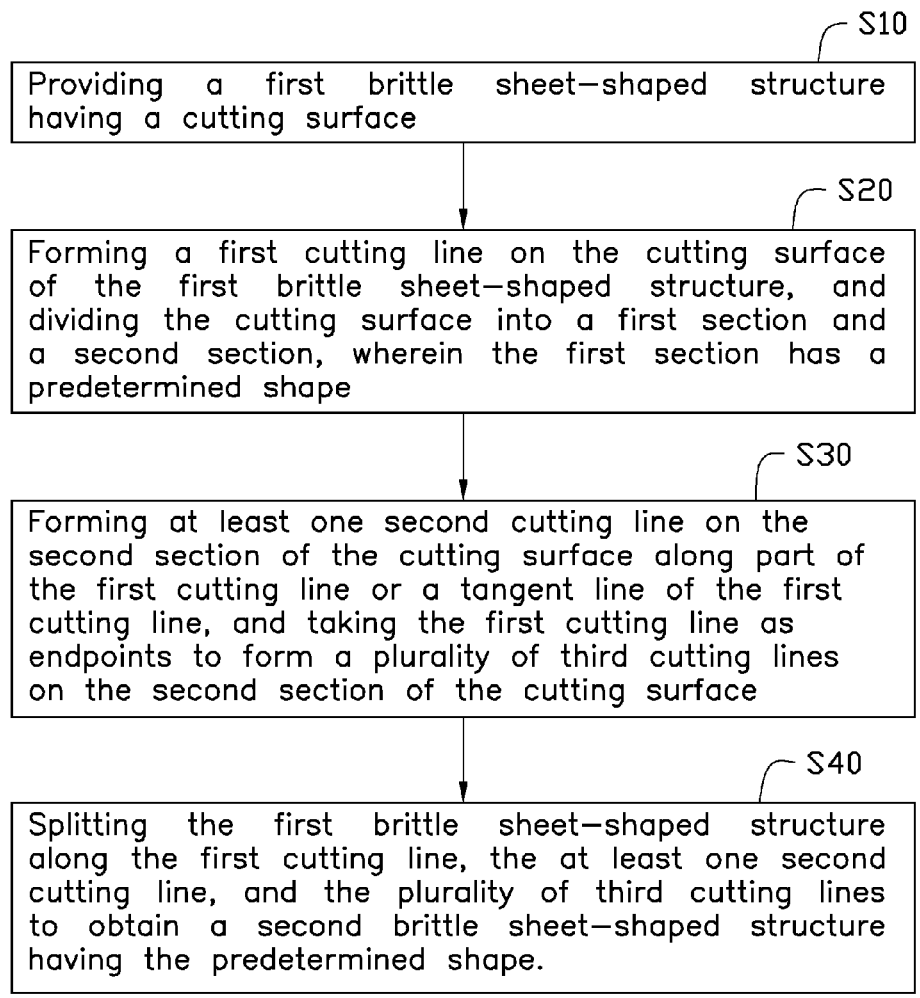
FIG. 1 is a flowchart of a method for cutting brittle sheet-shaped structure in one embodiment.

Referring to FIG. 1, a method for cutting brittle sheet-shaped structure in one embodiment includes the steps of:

(S1), providing a brittle sheet-shaped structure having a cutting surface;

(S2), forming a first cutting line on the cutting surface of the brittle sheet-shaped structure, and dividing the cutting surface into a first section and a second section by the first cutting line, wherein the first section has a predetermined shape;

(S3), forming at least one second cutting line on the second section of the cutting surface along part of the first cutting line or a tangent line of the first cutting line, and taking the first cutting line as endpoints to form a plurality of third cutting lines on the second section of the cutting surface; and (S4), splitting the brittle sheet-shaped structure along the first cutting line, the at least one second cutting line, and the plurality of third cutting lines to obtain a brittle sheet-shaped structure having the predetermined shape.

In step (S1), the brittle sheet-shaped structure includes a brittle material layer. The brittle sheet-shaped structure can be a single-layer structure or a multi-layer structure. When the brittle sheet-shaped structure is a single-layer structure, the single-layer structure is the brittle material layer. The brittle material layer can be made of non-metals, such as silicon wafer, ceramics, glasses, and quartz. In one embodiment, the brittle material is a single crystalline structure. When the brittle sheet-shaped structure is a multi-layer structure, then it includes the brittle material layer and a function layer disposed thereon. The function layer can be a circuit system, a carbon nanotube array, or a coating layer.

The cutting surface in step (S1) is a surface of the brittle material layer. When the brittle sheet-shaped structure is a multi-layer structure, the cutting surface is the surface of the brittle material layer which is far away from the function layer. An area in the horizontal direction of the brittle sheet-shaped structure is 10 times or more of an area in the vertical direction of the brittle sheet-shaped structure.

In step (S2), the first cutting line is formed along the predetermined shape on the cutting surface by a laser. The first cutting line is a closed curved line or a closed fold line. The predetermined shape of the first section is a shape of the required brittle sheet-shaped structure. The second section of the cutting surface is a section other than the first section in the cutting surface of the brittle sheet-shaped structure. The predetermined shape of the first section can be arcs or polygons. The arcs can be circle, ellipse, fan blade, and so on. The polygons can be triangle, quadrangle, pentagon, hexagon, octagon, and so on. The predetermined shape can also be other shapes with irregular boarders, such as wavy and zig-zag.

In step (S3), the at least one second cutting line and the plurality of third cutting lines are formed by the laser. If the first cutting line is a closed curved line, then the at least one second cutting line is along a tangent line of the first cutting line. If the first cutting line is a closed fold line, then the at least one second cutting line is along part of the first cutting line, which means that the at least one second cutting line partly overlaps with the first cutting line. The at least one second cutting line and the plurality of third cutting lines distribute around the first cutting line. In one embodiment, the at least one second cutting line partly overlaps with the first cutting line. In another embodiment, two second cutting lines are formed in the second section of the cutting surface, and the plurality of third cutting lines distributes between the two second cutting lines. In another embodiment, the at least one second cutting line is parallel with the plurality of third cutting lines. In another embodiment, the at least one second cutting line is not parallel with the plurality of third cutting lines. The at least one second cutting line can be formed prior to or later than the plurality of third cutting lines.

The "cutting line" in this disclosure is similar to "scratch" formed on the cutting surface, which does not penetrate through the brittle sheet-shaped structure. Additionally, all of the "first cutting line," the "second cutting line," and the "third cutting line" do not penetrate through the brittle material layer of the brittle sheet-shaped structure, thus, all of the "cutting lines" do not hurt the function layer.

In step (S4), the splitting of the brittle sheet-shaped structure can be along the at least one second cutting line first, and then along the plurality of third cutting lines. The splitting process can be finished by a mechanical force. In detail, the brittle sheet-shaped structure can firstly be split along the at least one second cutting line by a mechanical force, and then be split along the plurality of third cutting lines by the mechanical force.

Figure 2:
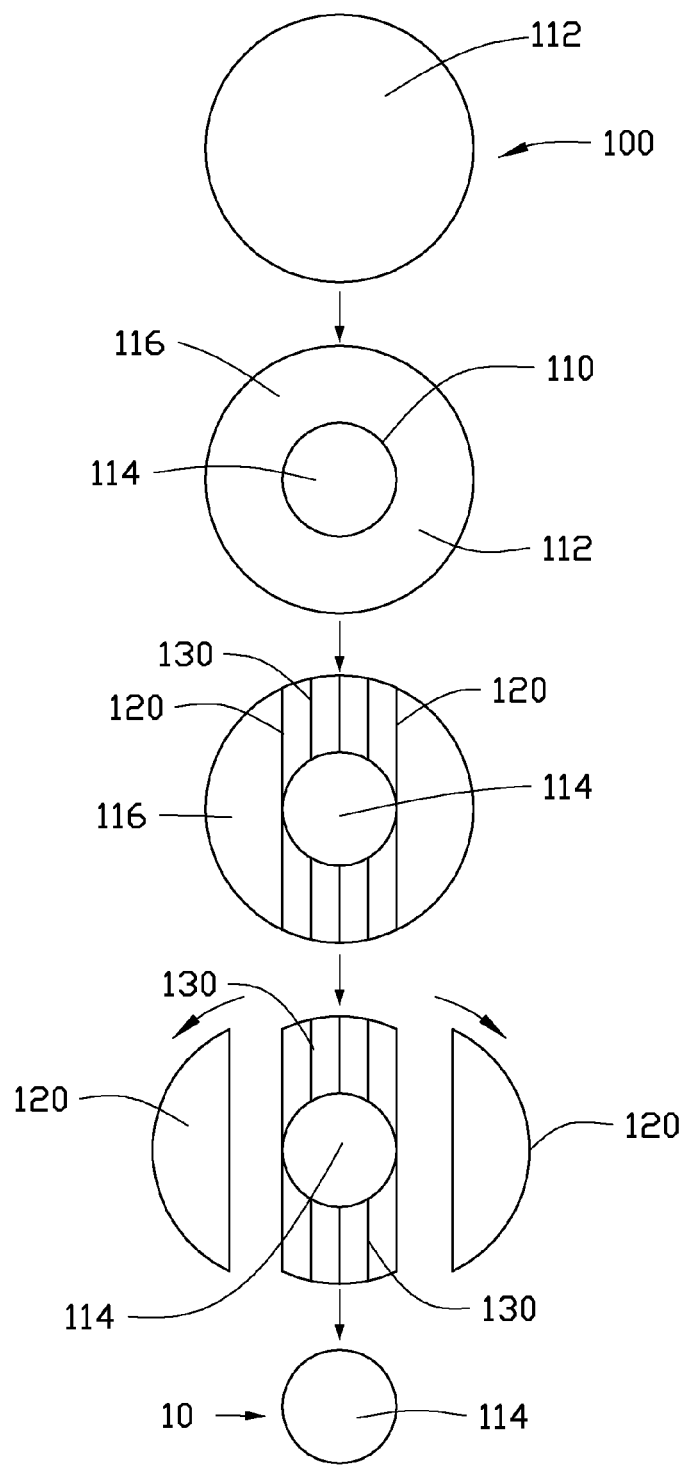
FIG. 2 is a process flow diagram of a method for cutting silicon wafer according to one embodiment.

Referring to FIG. 2, a method for cutting a silicon wafer 100 to obtain a smaller circular silicon plate 10 according to one embodiment includes the steps of:

(S1), providing a 4-inch silicon wafer 100 having a cutting surface 112;

(S2), forming a first cutting line 110 on the cutting surface 112 by a laser, and dividing the cutting surface 112 into a first section 114 and a second section 116, wherein a shape of the first cutting line 110 is a circle whose diameter is about 1 inch;

(S3), forming two second cutting lines 120 on the second section 116 along a tangent line of the first cutting line 110, and taking the first cutting line 110 as endpoints to form a plurality of third cutting lines 130 between the two second cutting lines 120 on the second section 116, wherein the two second cutting lines 120 are parallel with each other, and the plurality of third cutting lines 130 distributes evenly between the two second cutting lines 120 and are parallel with the two second cutting lines 120; and (S4), splitting the silicon wafer 100 along the two second cutting lines 120 first, and then splitting the remained silicon wafer 100 along the plurality of third cutting lines 130 to obtain a circular silicon plate 10 that has a diameter of about 1 inch.

Figure 3:
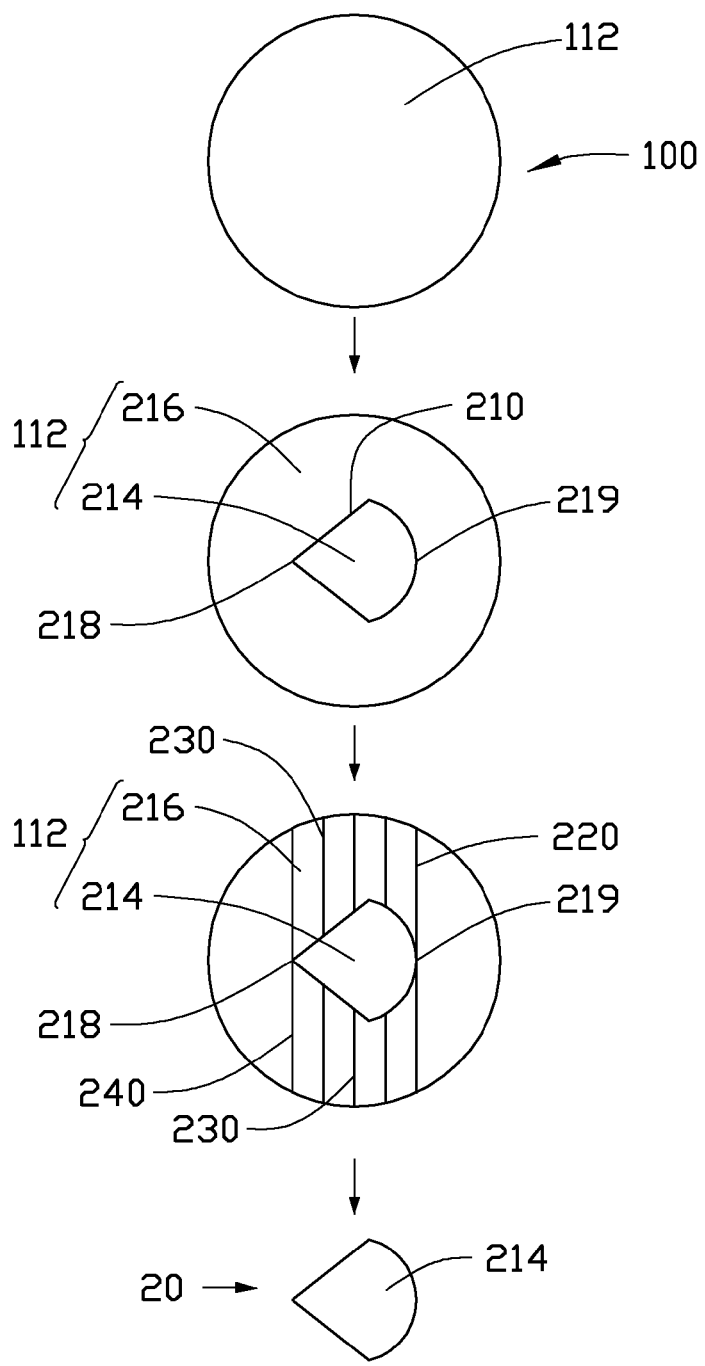
FIG. 3 is a process flow diagram of a method for cutting silicon wafer according to another embodiment.

Referring to FIG. 3, a method for cutting a silicon wafer 100 to obtain a fan blade silicon plate 20 according to another embodiment includes the steps of:

(S1), providing a 4-inch silicon wafer 100 having a cutting surface 112;

(S2), forming a first cutting line 210 on the cutting surface 112 by a laser, and dividing the cutting surface 112 into a first section 214 and a second section 216, wherein a shape of the first cutting line 210 is a fan, which has a circle center 218 and an arc 219;

(S3), forming a second cutting line 220 on the second section 216 along a tangent line of the arc 219 of the first cutting line 210 and a circle center cutting line 240 parallel to the second cutting line 220, and taking the first cutting line 210 as endpoints to form a plurality of third cutting lines 230 between the second cutting line 220 and the circle center cutting line 240 on the second section 216, wherein the circle center cutting line 240 passes through the circle center 218, the plurality of third cutting lines 230 distributes evenly between the second cutting line 220 and the circle center cutting line 240 and are parallel with the second cutting line 220; and (S4), splitting the silicon wafer 100 along the second cutting line 220 and the circle center cutting line 240 first, and then splitting the remained silicon wafer 100 along the plurality of third cutting lines 230 to obtain a fan blade silicon plate 20.

Figure 4:
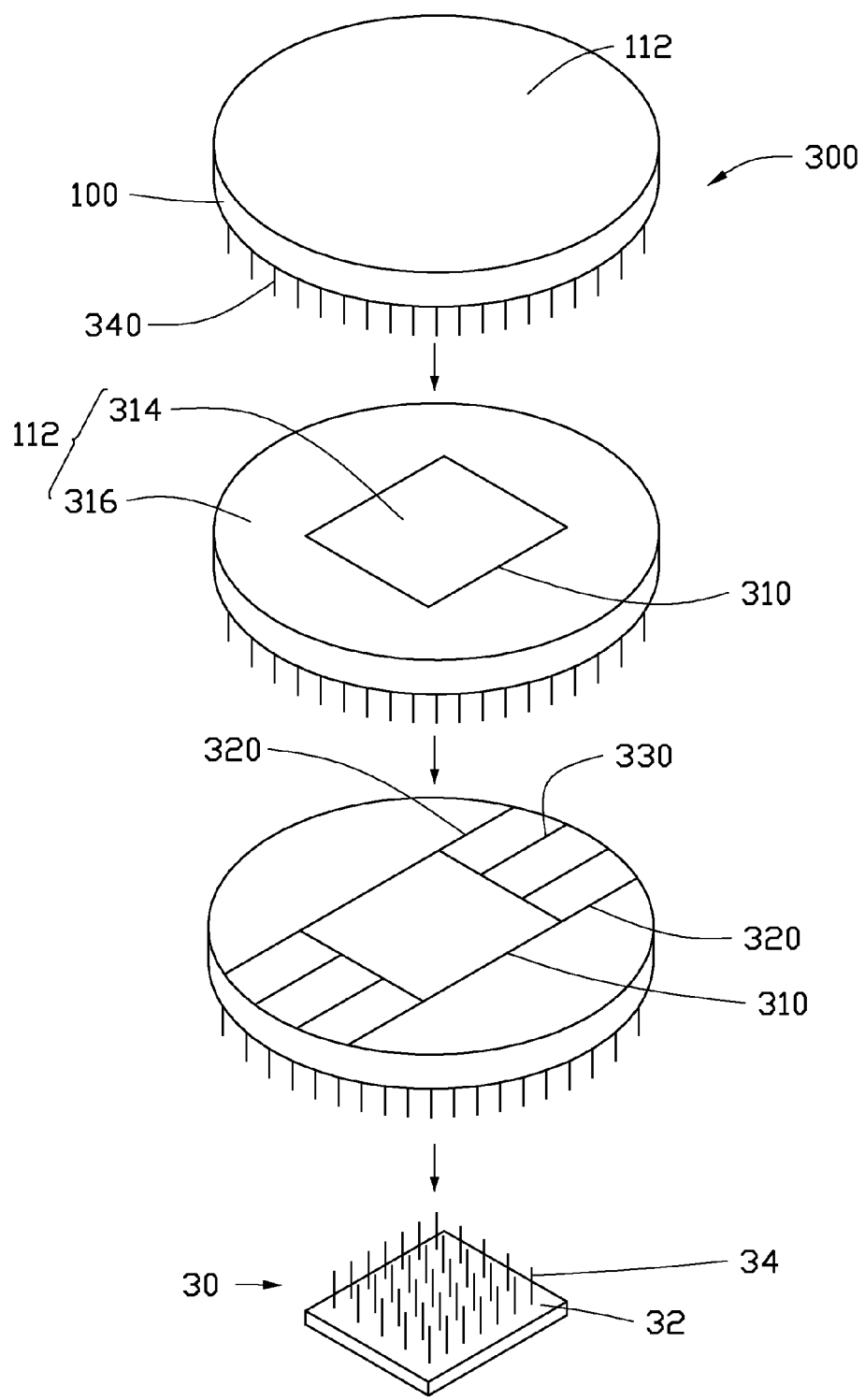
FIG. 4 is a process flow diagram of a method for cutting silicon wafer having carbon nanotube array thereon according to one embodiment.

Referring to FIG. 4, a method for cutting a brittle sheet-shaped structure 300 to obtain a quadrangle brittle sheet-shaped structure 30 according to another embodiment includes the steps of:

(S1), providing a brittle sheet-shaped structure 300 including a 4-inch silicon wafer 100 and a carbon nanotube array 340, wherein the silicon wafer 100 has a cutting surface 112, and the carbon nanotube array 340 is disposed on a surface of the silicon wafer 100 which is opposite to the cutting surface 112;

(S2), forming a first cutting line 310 on the cutting surface 112 by a laser, and dividing the cutting surface 112 into a first section 314 and a second section 316, wherein a shape of the first cutting line is a quadrangle;

(S3), forming two second cutting lines 320 on the second section 316 along part of the first cutting line 310, and taking the first cutting line 310 as endpoints to form a plurality of third cutting lines 330 between the two second cutting lines 320 on the second section 316, wherein the two second cutting lines 320 are parallel to each other and partly overlap with the first cutting line 310, and the plurality of third cutting lines 330 distributes evenly between the two second cutting lines 320 and are parallel with the two second cutting lines 320; and (S4), splitting the brittle sheet-shaped structure 300 along the two second cutting lines 320 first, and then splitting the brittle sheet-shaped structure 300 along the plurality of third cutting lines 330 to obtain a quadrangle brittle sheet-shaped structure 30, wherein the quadrangle brittle sheet-shaped structure 30 includes a quadrangle silicon plate 32 and a quadrangle carbon nanotube array 34 disposed thereon.

The first cutting lines can ensure shapes of the required sheet-shaped structures. The second cutting lines, the third cutting lines, and the circle center cutting lines can reduce or disperse stresses produced on the first sections along the first cutting lines when splitting the brittle sheet-shaped structures. Meanwhile, the second cutting lines, the third cutting lines, and the circle center cutting lines can guide the brittle sheet-shaped structures to split along these cutting lines and obtain various particular and sheet-shaped brittle structures, especially for those single crystalline brittle sheet-shaped structures. Additionally, the cutting lines are formed on surfaces of the brittle material layers, which can reduce or avoid contaminating of the function layers, such as the carbon nanotube arrays.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for cutting brittle sheet-shaped structure comprising:
   (a) providing a first brittle sheet-shaped structure having a cutting surface;
   (b) forming a first cutting line on the cutting surface of the first brittle sheet-shaped structure, and dividing the cutting surface into a first section and a second section, wherein the first section has a predetermined shape;

(c) forming at least one second cutting line on the second section of the cutting surface along part of the first cutting line or a tangent line of the first cutting line, and taking the first cutting line as endpoints to form a plurality of third cutting lines on the second section of the cutting surface, wherein the elongation of each of the plurality of third cutting lines is across the first section; and (d) splitting the first brittle sheet-shaped structure along the first cutting line, the at least one second cutting line, and the plurality of third cutting lines to obtain a second brittle sheet-shaped structure having the predetermined shape.

2. The method as claimed in claim 1, wherein the first brittle sheet-shaped structure comprises a brittle material layer, and the brittle material layer is made of non-metals.

3. The method as claimed in claim 2, wherein the brittle material layer comprises silicon, ceramics, glasses, or quartz.

4. The method as claimed in claim 2, wherein the first brittle sheet-shaped structure further comprises a function layer, and the function layer is disposed on a surface of the brittle material layer which is opposite to the cutting surface.

5. The method as claimed in claim 4, wherein the function layer is a circuit system, a carbon nanotube array, or a coating layer.

6. The method as claimed in claim 1, wherein in step (b) the first cutting line is formed along the predetermined shape on the cutting surface by a laser.

7. The method as claimed in claim 1, wherein the first cutting line is a closed curved line or a closed fold line.

8. The method as claimed in claim 1, wherein the predetermined shape is selected from the group consisting of circle, ellipse, fan blade, triangle, quadrangle, pentagon, hexagon, octagon, wavy, and zigzag.

9. The method as claimed in claim 1, wherein in step (c) the at least one second cutting line and the plurality of third cutting lines are formed on the second section by a laser.

10. The method as claimed in claim 9, wherein in step (c) two second cutting lines are formed first and the plurality of third cutting lines are formed between the two second cutting lines, and the two second cutting lines are parallel with the plurality of third cutting lines.

11. The method as claimed in claim 1, wherein in step (d) the splitting of the first brittle sheet-shaped structure is along the at least one second cutting line first, and then along the plurality of third cutting lines.

12. A method for cutting silicon wafer comprising:
(e) providing a silicon wafer having a cutting surface;
(f) forming a first cutting line on the cutting surface, and dividing the cutting surface into a first section and a second section, wherein the first section has a predetermined shape;
(g) forming two second cutting lines on the second section along part of the first cutting line or a tangent line of the first cutting line, and taking the first cutting line as endpoints to form a plurality of third cutting lines between the two second cutting lines, and the plurality of third cutting lines distributes evenly between the two second cutting lines and are parallel with the two second cutting lines; and
(h) splitting the silicon wafer along the two second cutting lines first, and then splitting the remaining silicon wafer along the plurality of third cutting lines to obtain a silicon plate having the predetermined shape.

13. The method as claimed in claim 12, wherein the predetermined shape is a circle.

14. The method as claimed in claim 12, wherein the predetermined shape is a fan blade having an arc and a circle center, one of the two second cutting lines passes through the circle center, and the other one of the two second cutting lines is along a tangent line of the arc.

15. The method as claimed in claim 12, wherein the predetermined shape is a quadrangle, and the two second cutting lines partly overlap with the first cutting line.

16. A method for cutting brittle sheet-shaped structure comprising:
(i) providing a first brittle sheet-shaped structure comprising a silicon wafer and a carbon nanotube array disposed on a first surface of the silicon wafer, wherein the silicon wafer has a cutting surface which is opposite to the first surface;
(j) forming a first cutting line on the cutting surface by a laser, and dividing the cutting surface into a first section and a second section, wherein the first section has a predetermined shape;
(k) forming at least one second cutting line on the second section of the cutting surface along part of the first cutting line or a tangent line of the first cutting line, and taking the first cutting line as endpoints to form a plurality of third cutting lines on the second section of the cutting surface, wherein the elongation of each of the plurality of third cutting lines is across the first section; and
(l) splitting the first brittle sheet-shaped structure along the first cutting line, the at least one second cutting line, and the plurality of third cutting lines to obtain a second brittle sheet-shaped structure having the predetermined shape.

17. The method as claimed in claim 16, wherein the predetermined shape is a quadrangle.

18. The method as claimed in claim 16, wherein in step (j) the at least one second cutting line and the plurality of third cutting lines are formed on the second section by a laser.

19. The method as claimed in claim 18, wherein in step (j) two second cutting lines are formed first and the plurality of third cutting lines are formed between the two second cutting lines, and the two second cutting lines are parallel with the plurality of third cutting lines.

20. The method as claimed in claim 19, wherein the predetermined shape is a fan blade having an arc and a circle center, one of the two second cutting lines passes through the circle center, and the other one of the two second cutting lines is along a tangent line of the arc.

* * * * *